US011081390B2

(12) United States Patent
Holverson et al.

(10) Patent No.: US 11,081,390 B2
(45) Date of Patent: Aug. 3, 2021

(54) MULTI-PASS PLATING PROCESS WITH INTERMEDIATE RINSE AND DRY

(71) Applicant: Texas Instruments Incorporated, Dallas, TX (US)

(72) Inventors: Peter John Holverson, Dallas, TX (US); Sudtida Lavangkul, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/236,735

(22) Filed: Dec. 31, 2018

(65) Prior Publication Data
US 2020/0211898 A1 Jul. 2, 2020

(51) Int. Cl.
*H01L 21/768* (2006.01)
*H01L 23/532* (2006.01)

(52) U.S. Cl.
CPC .. *H01L 21/76873* (2013.01); *H01L 21/76814* (2013.01); *H01L 21/76843* (2013.01); *H01L 21/76853* (2013.01); *H01L 23/53238* (2013.01)

(58) Field of Classification Search
CPC ..... H01L 21/76873; H01L 2224/03462; H01L 21/76814; H01L 23/53238; H01L 21/76853; H01L 21/76843
See application file for complete search history.

(56) References Cited

U.S. PATENT DOCUMENTS

2012/0261254 A1* 10/2012 Reid ............... C25D 7/123
204/227
2018/0096888 A1* 4/2018 Naik ............... H01L 21/76846

* cited by examiner

*Primary Examiner* — Cuong B Nguyen
(74) *Attorney, Agent, or Firm* — Jacqueline J. Garner; Charles A. Brill; Frank D. Cimino

(57) ABSTRACT

A method includes electroplate depositing a first metal layer to a first thickness on a metal seed layer, rinsing the first metal layer with deionized water, and after the first rinse process, drying the wafer. The method also includes performing one or more additional electroplating processes that respectively deposit an additional metal layer to a second thickness over the first metal layer, performing an additional rinse process that rinses the additional metal layer with deionized water, and performing an additional drying processes that dries the wafer.

17 Claims, 14 Drawing Sheets

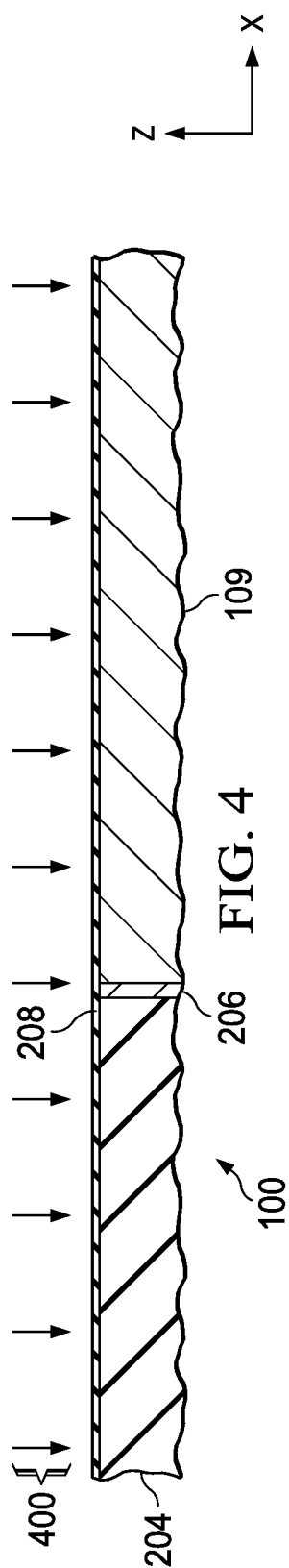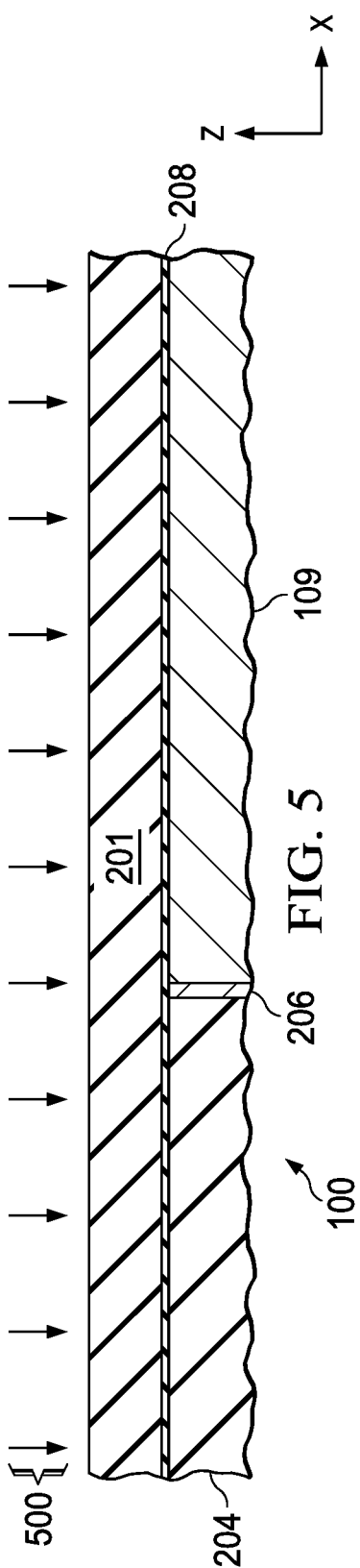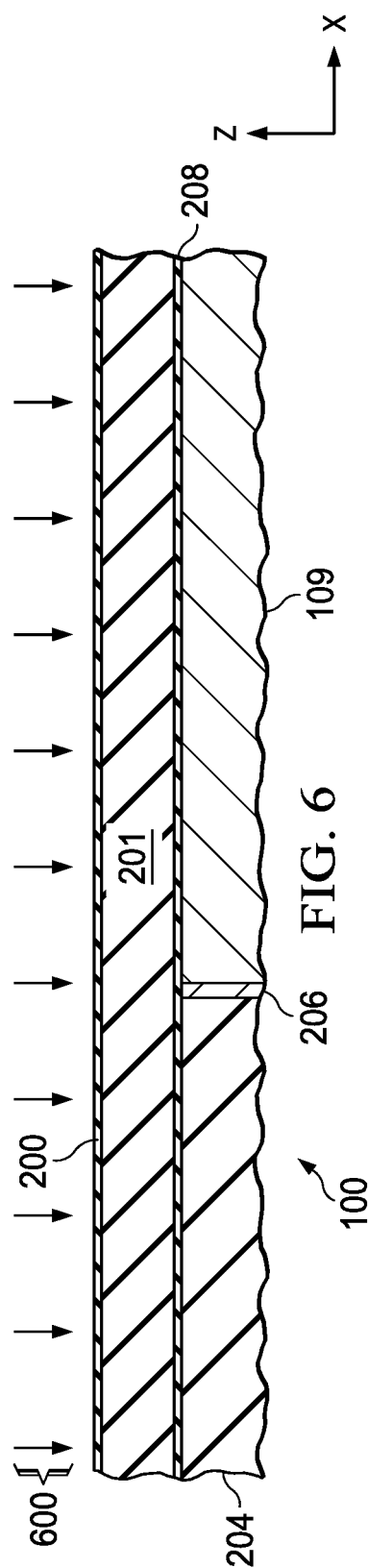

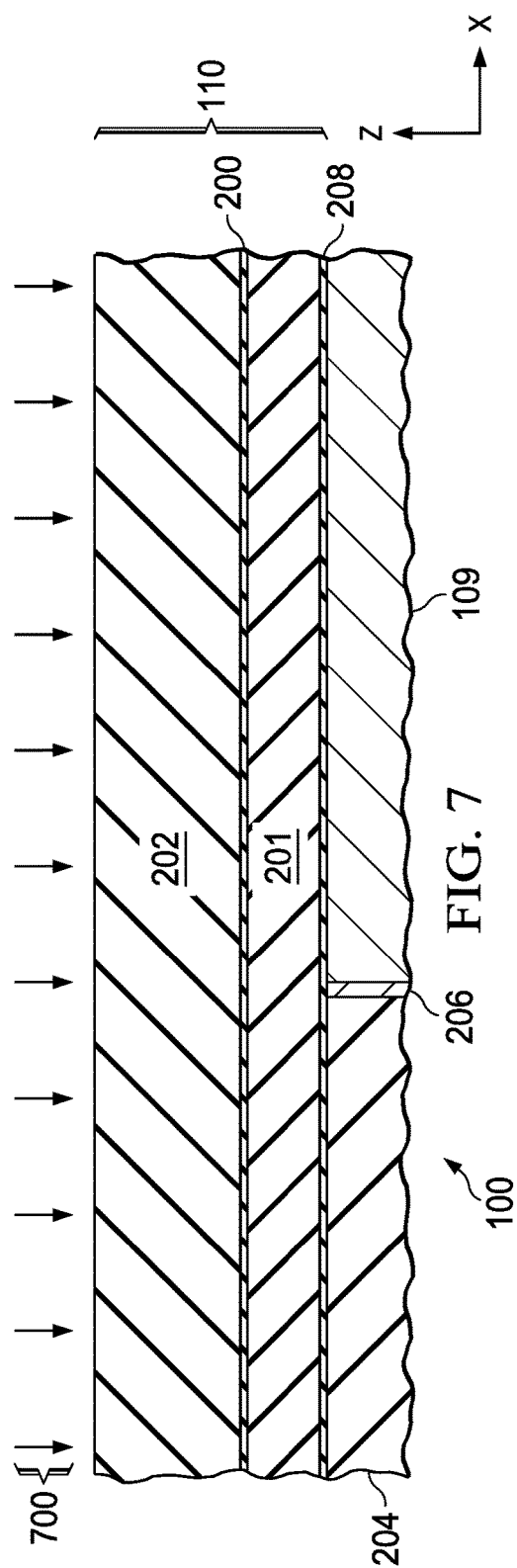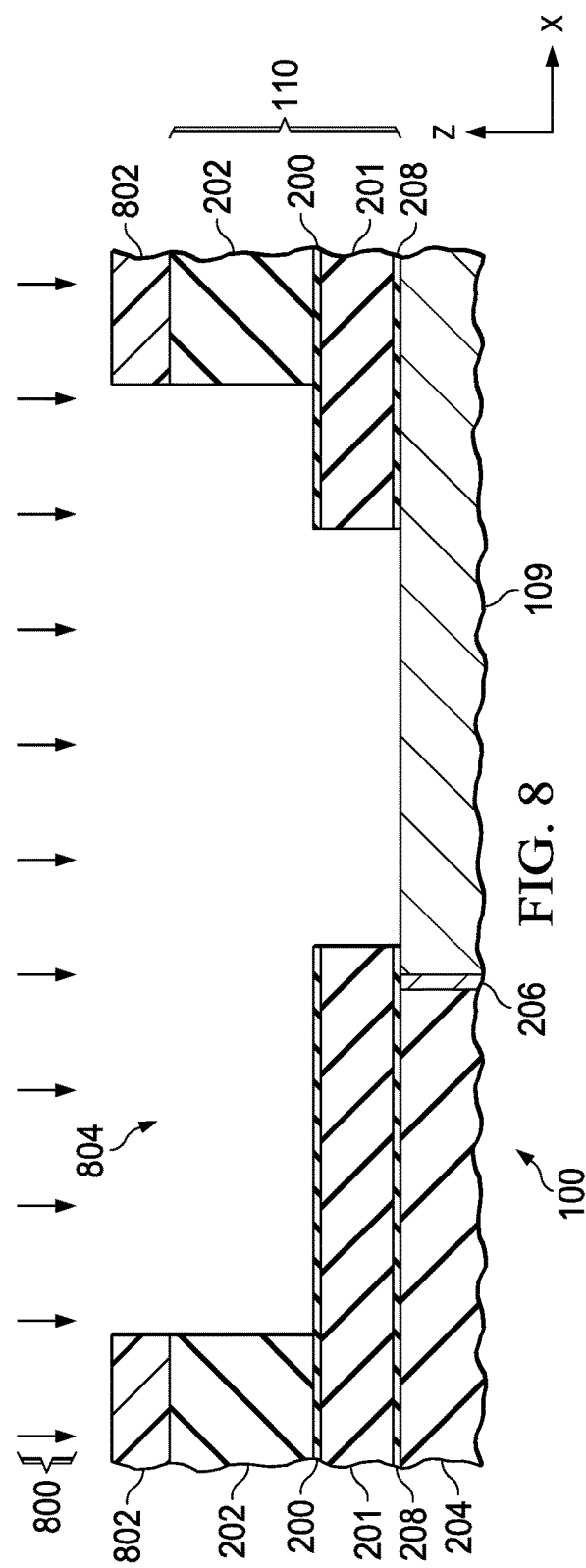

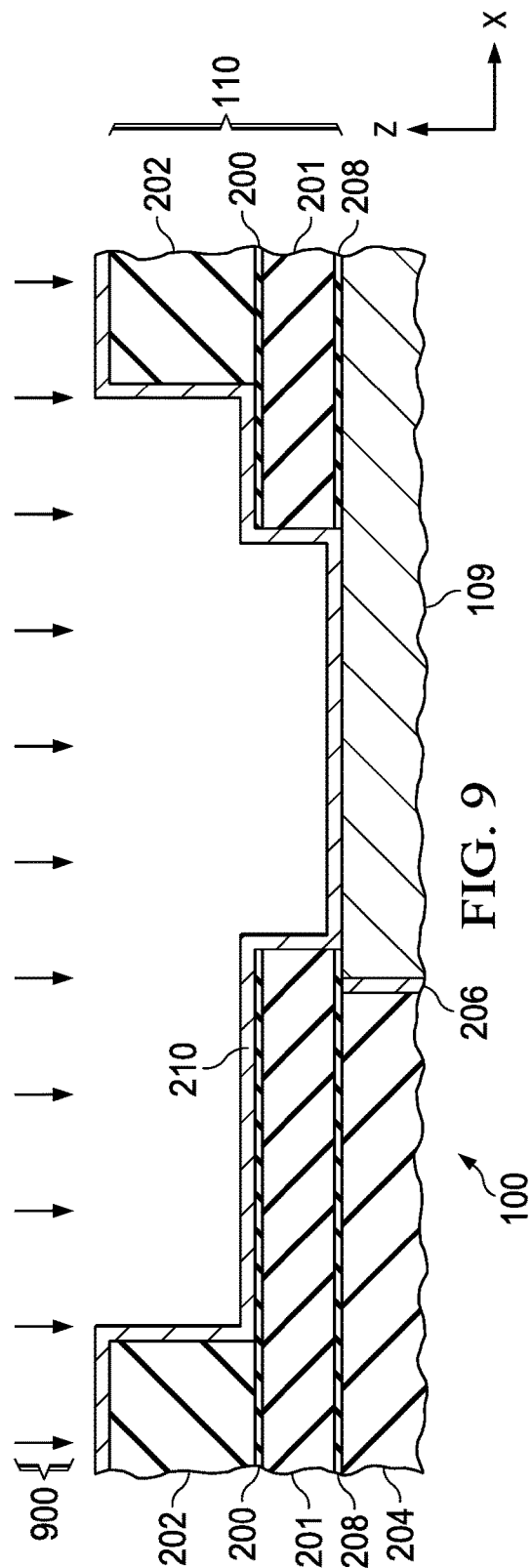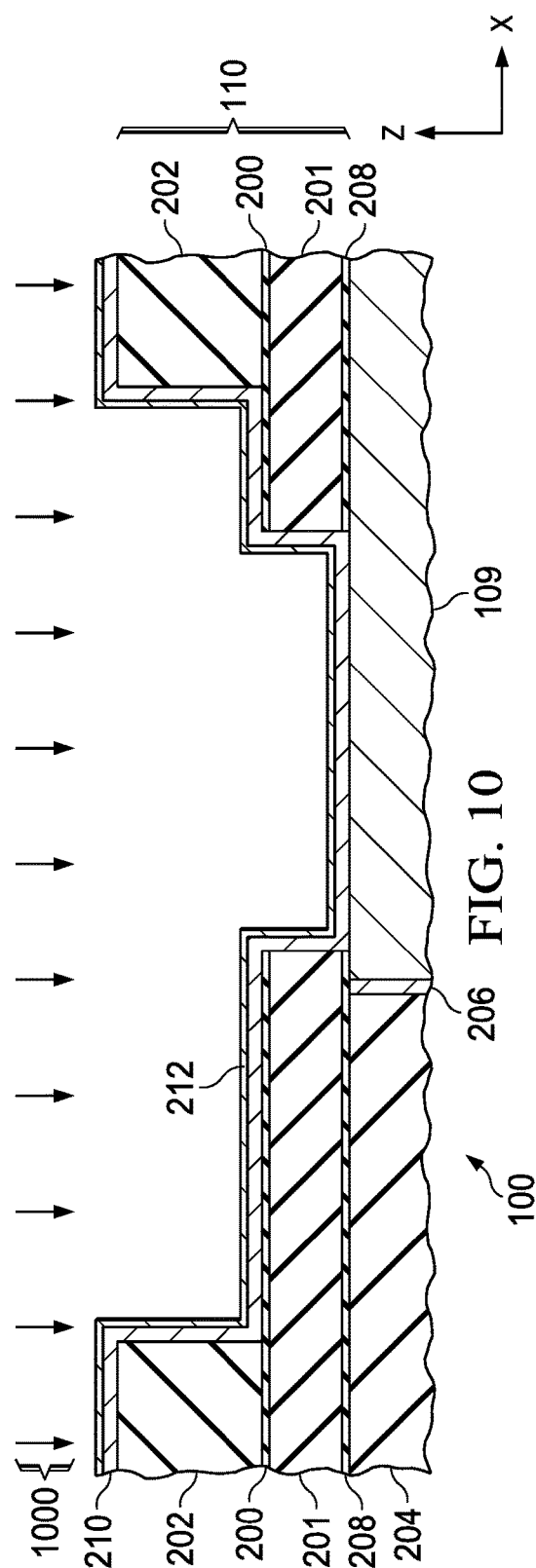

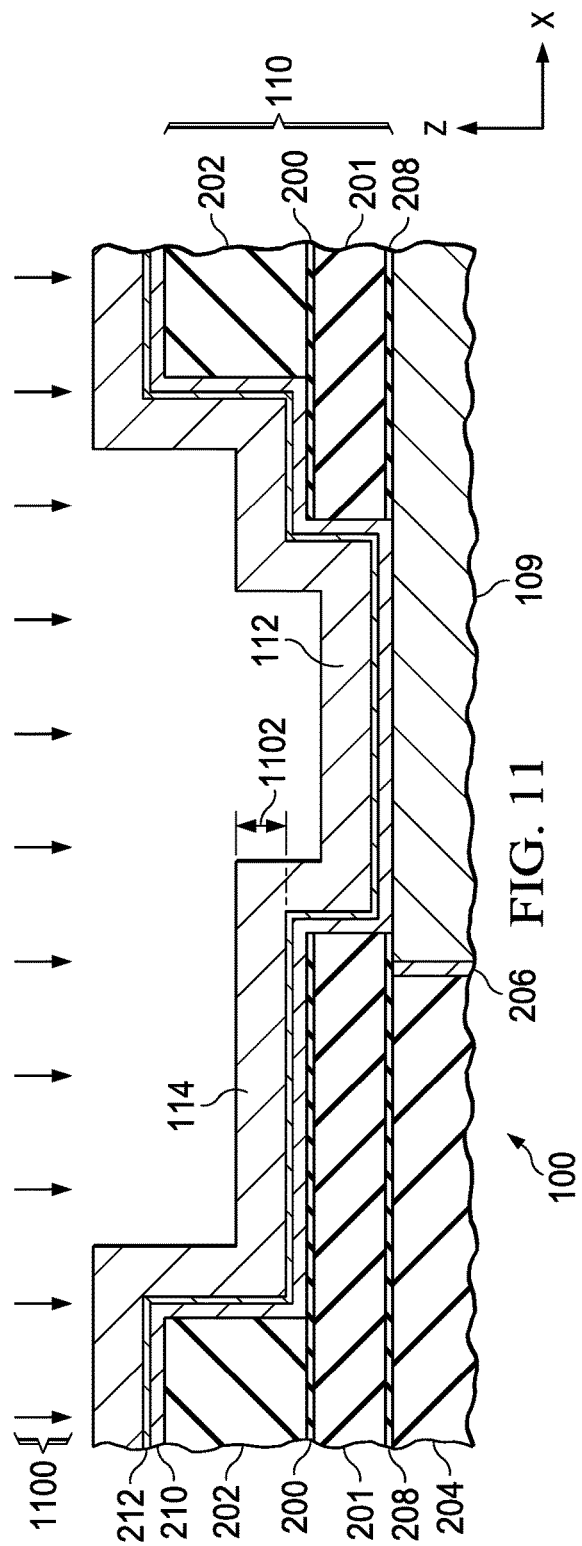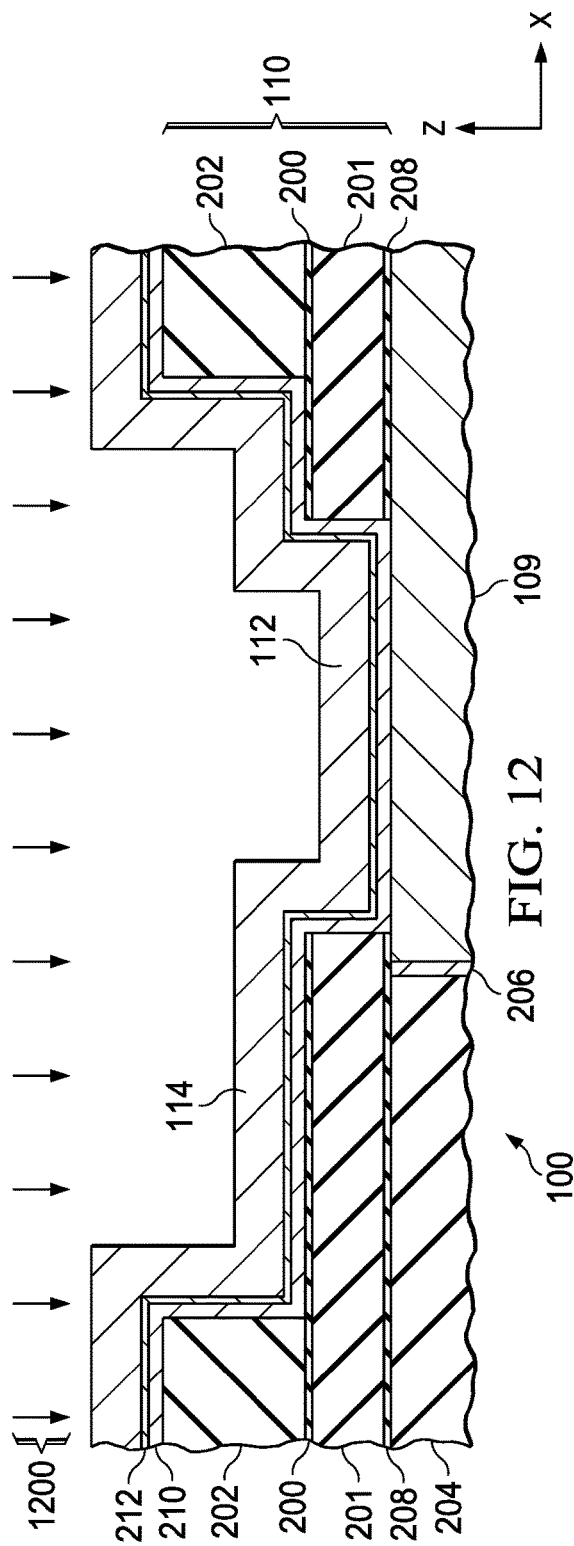

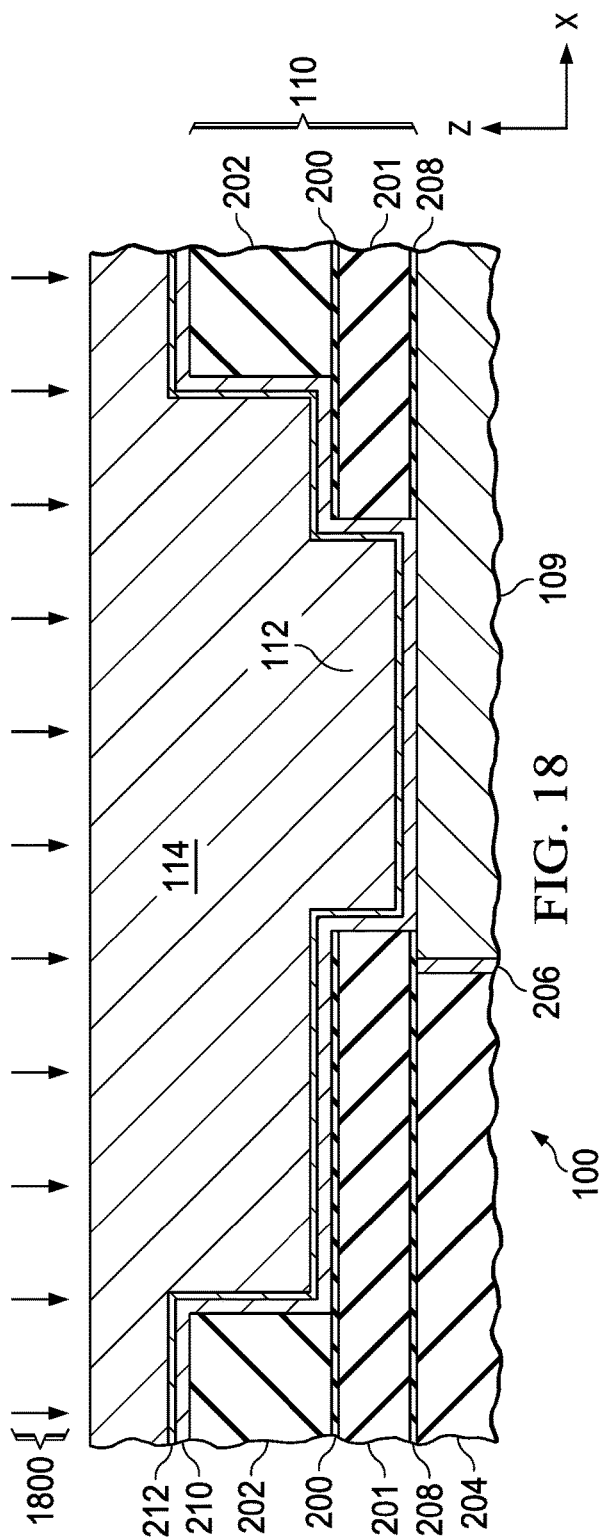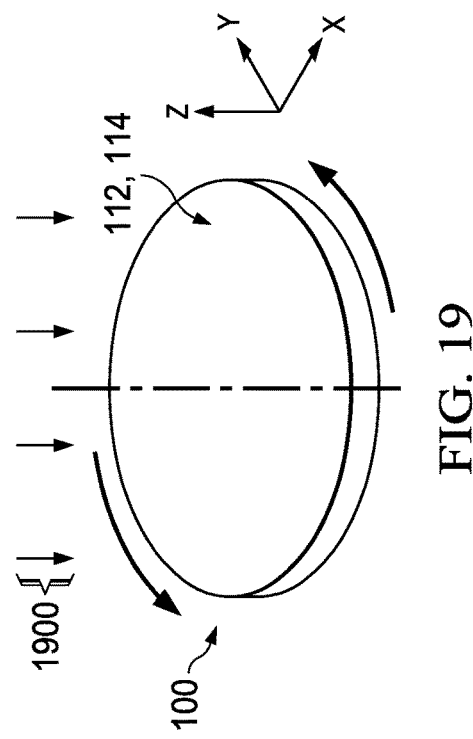
FIG. 18
FIG. 19

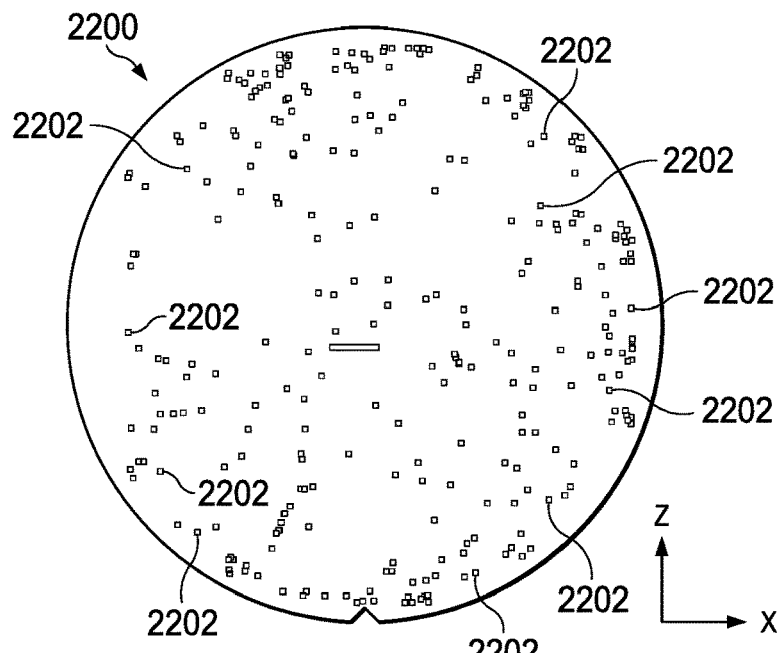
FIG. 22
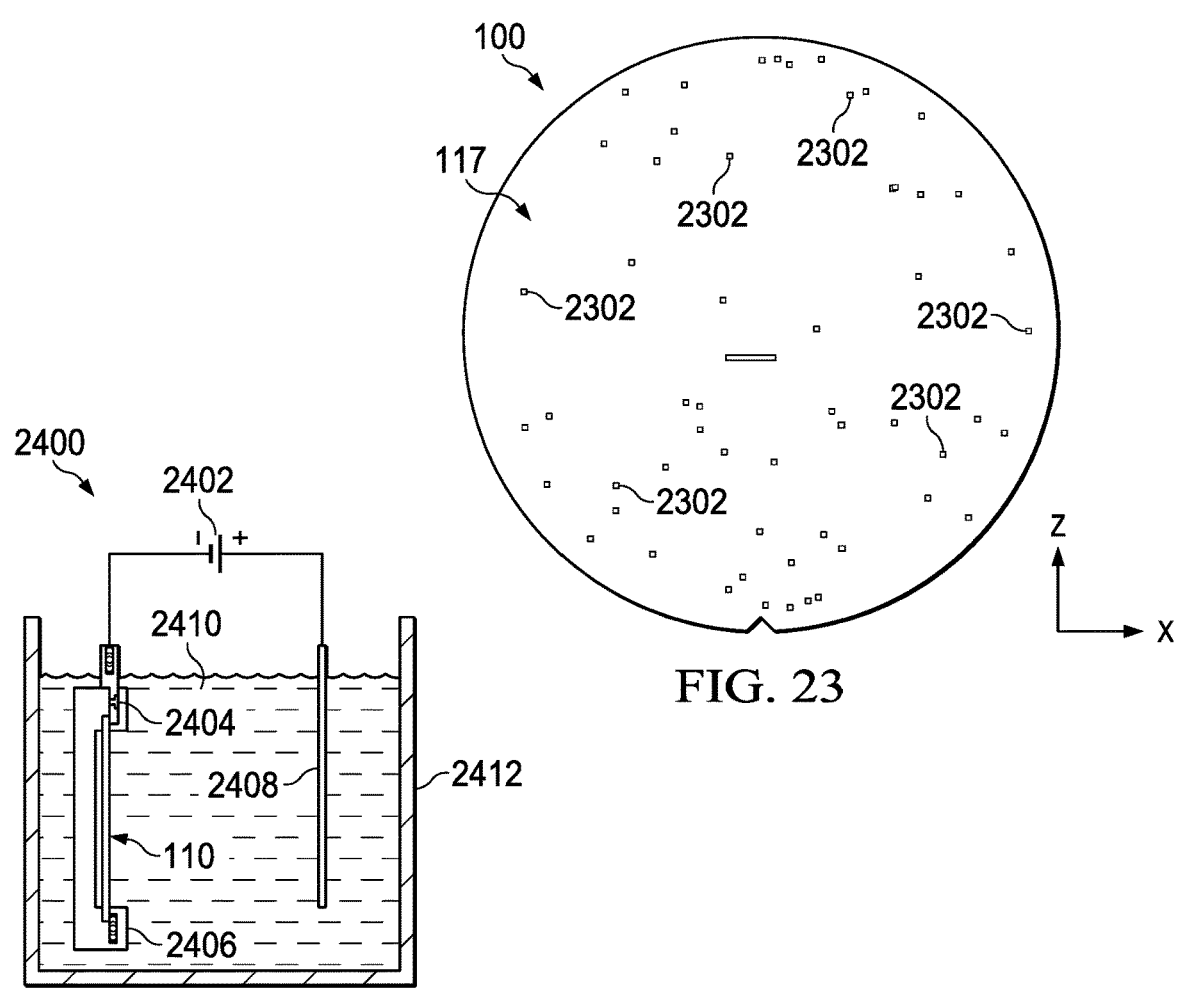
FIG. 23
FIG. 24

MULTI-PASS PLATING PROCESS WITH INTERMEDIATE RINSE AND DRY

BACKGROUND

Electroplated metal layers, especially at high thickness, are prone to protrusion defects that extend outward from a surface of the plated material, referred to as hillocks. Hillock defects with high topography can cause degradation in manufacturing yield or reliability of electronic devices, particularly in single or multilayer metallization structures. In particular, sufficiently large hillocks in metal lines or vias of a single or dual damascene metallization layer can cause shorts and/or open circuits in the metallization structure, as well as difficulty in bonding to an uppermost metal layer, for example, during wire bonding. Hillock defects in copper can be caused by a stress relief mechanism where atomic migration occurs from a bulk portion of the plated copper to the surface when copper filled damascene trenches are exposed to temperatures of about 250 degrees C. or more. The stress relief mechanism results from a mismatch in coefficient of thermal expansion (CTE) for copper and the surrounding silicon dioxide ($SiO_2$) dielectric in a metallization layer. The larger CTE of the deposited copper can lead to a high compressive stress within the damascene trench. The hillock defects and associated stress can result from material migration in thermal cycles after deposition, such as during a post plating anneal step. In addition, plating thick metal layers can cause growth of passivation films on the anode of the plating system, which can lead to high resistance and potential current faults for the plating system equipment. Such passivation films grow faster for extended plate times and high currents for single step thick copper films.

SUMMARY

Described examples include a method of forming a metal layer. The method includes electroplate depositing a first metal layer to a first thickness on a metal seed layer, rinsing the first metal layer with deionized water, and after the first rinse process, drying the wafer. The method also includes performing one or more additional electroplating processes that respectively deposit an additional metal layer to a second thickness over the first metal layer, performing an additional rinse process that rinses the additional metal layer with deionized water, and performing an additional drying processes that dries the wafer.

An example electronic device includes an electronic component on or in a semiconductor substrate, and a metallization structure disposed over the electronic component and the semiconductor substrate. The metallization structure includes a dielectric layer with an opening, a metal seed layer on the dielectric layer in the opening, and a metal layer on the metal seed layer in the opening. The metal layer includes an upper surface, a thickness greater than 2 μm, and a defect density of less than 700 defects/$m^2$ for protrusions of 0.2 μm or more from the upper surface.

BRIEF DESCRIPTION OF THE DRAWINGS

FIGS. 4-21 are partial sectional side elevation views of the wafer of FIG. 1 undergoing fabrication processing according to the method of FIG. 3.

FIG. 22 is a top plan view of a wafer with a thick copper layer having hillock protrusion defects formed using a single pass electroplating process.

FIG. 23 is a top plan view of a wafer with a thick copper layer having significantly reduced protrusion defects formed using a multi-pass electroplating process with intervening rinsing and drying steps.

FIG. 24 is a simplified side elevation view of an example electroplating system.

DETAILED DESCRIPTION

Figure 1:
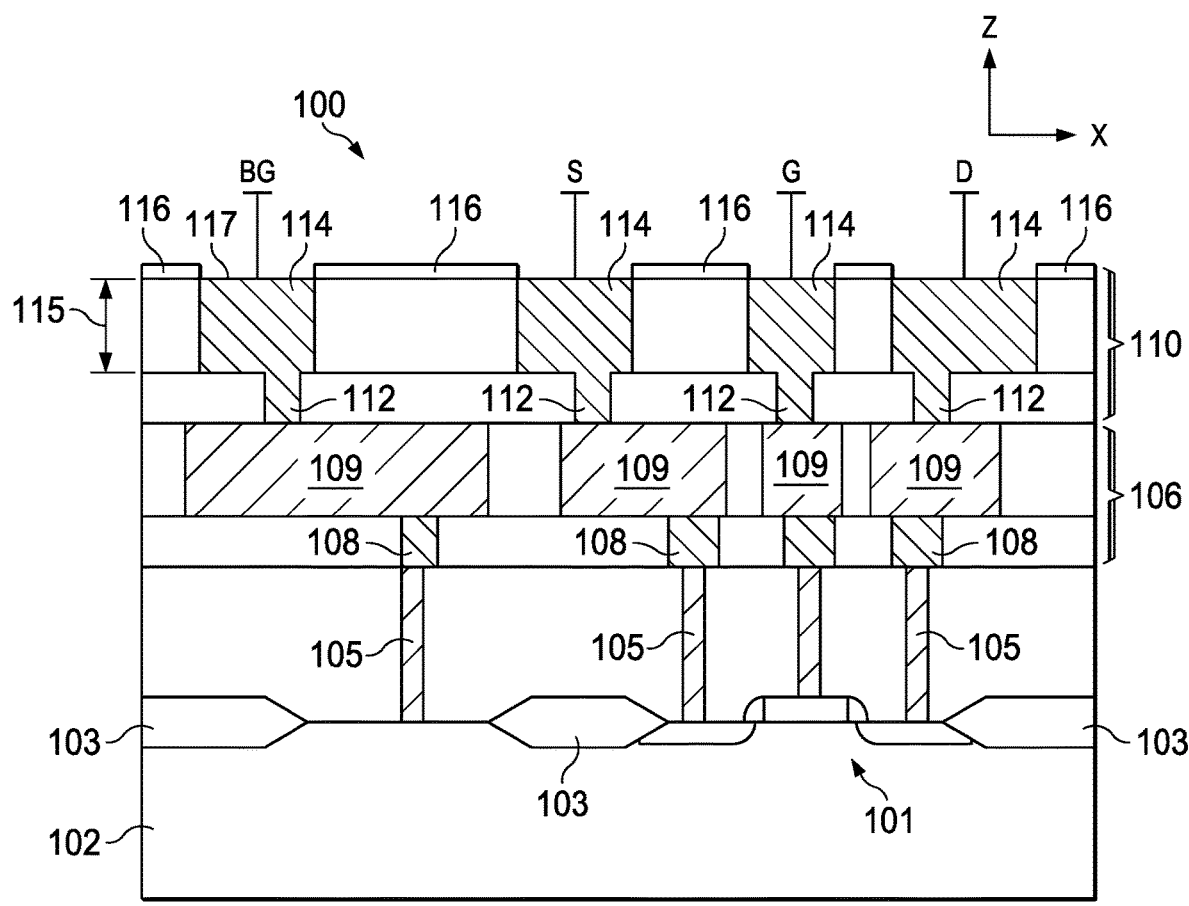
FIG. 1 is a partial sectional side elevation view of a wafer with thick copper metal layers in a metallization structure.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

Figure 2:
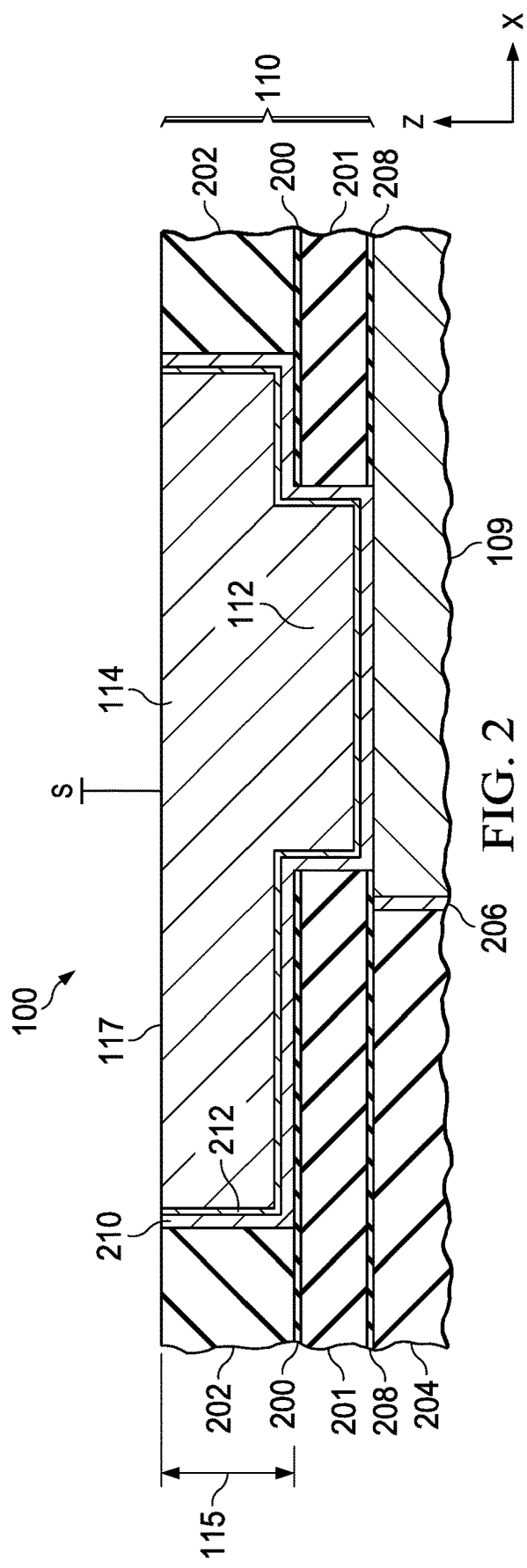
FIG. 2 is a partial sectional side elevation view showing further details of the thick copper metal layers in the wafer of FIG. 1.

FIGS. 1 and 2 show partial side views of an example wafer 100 with a transistor component 101 formed on and/or in a semiconductor substrate 102 (e.g., silicon, gallium nitride, silicon carbide, silicon-on-insulator (SOI), etc.). The example wafer 100 in FIG. 1 includes a single transistor component 101. In other implementations, the wafer 100 can include integrated circuits having multiple electronic components. The wafer 100 in this example includes a multilayer metallization structure with multiple conductive features that are respectively electrically connected to corresponding terminals (source "S", drain "D", gate "G", and a back gate contact BG) of the transistor component 101. The example wafer 100 also includes isolation structures 103 disposed on select portions of an upper surface or side of the substrate 102. The isolation structures 103 can be shallow trench isolation (STI) features or field oxide (FOX) structures in some examples.

The example wafer 100 also includes a multilayer metallization structure disposed above the substrate 102. The metallization structure includes a first dielectric structure layer 104 formed over the substrate 102, as well as a multilevel upper metallization structure. In one example, the first dielectric structure layer 104 is a pre-metal dielectric (PMD) layer disposed over the transistor 101, the isolation structures 103, and the upper surface of the substrate 102. In one example, the first dielectric structure layer 104 includes silicon dioxide ($SiO_2$) deposited over the transistor 101, the substrate 102 and the isolation structures 103. The metallization structure includes tungsten plugs or contacts 105 that extend from various terminals of the transistor 101 through the PMD layer 104, as well as overlying dielectric layers 106 and 110, referred to herein as interlayer or interlevel dielectric (ILD) layers. Different numbers of layers can be used in different implementations. In one example, the first ILD layer 106 and the final ILD layer 110 are formed of silicon dioxide (SiO$_2$) or other suitable dielectric material. In certain implementations, the individual layers of the multi-layer upper metallization structure are formed in two stages, including an intra-metal dielectric (IMD, not shown) sublayer and an ILD sublayer overlying the IMD sublayer, as shown in FIG. 2. The individual IMD and ILD sublayers can be formed of any suitable dielectric material or materials, such as SiO$_2$-based dielectric materials.

The first ILD layer 106 and the upper ILD layer 110 include conductive vias 108 and 112, respectively, such as copper, tungsten, or aluminum. The vias 108 and 112 in this example provide electrical connection from the metallization features of successive layers, for example, to connect lines of an individual layer to an overlying metallization layer. The metallization structure in this example also includes metal layers, referred to as conductive lines 109 and 114, for routing in the layers 106 and 110, respectively.

As further shown in the example of FIG. 2, the vias 112 and the line metal layers 114 in the upper metallization layer 110 are formed using a dual damascene process where the metal via 112 and the metal lines 114 are formed as a unitary multilayer structure. In one example, the metal layer 114 has a thickness 115 of over 2 µm, such as more than 5 µm (e.g., 6 µm). The upper ILD dielectric layer 110 in one example is covered by one or more passivation layers 116 (e.g., protective overcoat (PO) and/or passivation layers), for example, silicon nitride (SiN), silicon oxynitride (SiO$_x$N$_y$), or silicon dioxide (SiO$_2$). In one example, the passivation layer or layers 116 include one or more openings that expose a portion of the metal layers 114 to allow electrical connection of the metal layers 114 to corresponding contacts or conductive features (e.g., conductive pillars, solder bumps, etc., not shown), or to allow soldering to bond wires (not shown).

The substrate 102, the electronic component 101, the first dielectric structure layer 104 and the upper metallization structure 106, 110 form a wafer 100 with an upper side or surface 117. The example in FIGS. 1 and 2 is shown as a unitary wafer structure prior to die separation or singulation. The top metallization layer 110 includes example metal layers 114, such as upper most copper lines or pads with exposed upper sides or surfaces at an upper side 117 of the wafer 100 at the top of the uppermost metallization layer 110. Any number of exposed metal layers 114 may be provided. Some of the metal layers 114 are electrically coupled with the transistor 101 through the metallization structure of the wafer 100.

FIG. 2 illustrates an upper portion of one example with a dual damascene implementation of the upper metallization layer 110. The example upper dielectric layer 110 includes an etch stop layer 200 that separates dielectric sublayers 201 and 202. The respective dielectric sublayers 201 and 202 each have an opening filled with copper or other conductive metal to form a via 112 and a line 114 as a continuous metal structure, referred to as a metal layer. The illustrated portion in FIG. 3 also includes an underlying dielectric sublayer 204 and a portion of a diffusion barrier layer 206 between the dielectric sublayer 204 and the conductive line 109 of the underlying metallization layer 106. An etch stop layer 208 extends between the dielectric sublayers 201 and 204. The openings of the respective dielectric sublayers 201 and 202 in the upper metallization layer 110 also include a conductive diffusion barrier layer 210 that extends along the bottom and sidewalls of the openings. A metal seed layer 212 is disposed along the diffusion barrier layer 210 in the openings.

The metal layer 112, 114 is disposed on the metal seed layer 212 in the openings of the dielectric sublayers 201 and 202. The metal layer 112, 114 includes the upper surface 117. In one example, the metal layer 112, 114 has a defect density of less than 700 defects/m$^2$ for hillock defects or other protrusions of 0.2 µm or more from the upper surface 117. In one example, the thickness 115 of the metal layer 112, 114 is greater than 2 µm. The thickness 115 in one example is greater than 5 µm, such as 6 µm. In the illustrated example, the metal seed layer 212 and the metal layer 112, 114 are copper. In other examples, the metal layer 112, 114 can be a metal capable of being deposited, with or without a seed layer, by electroplating. In the example of FIGS. 1 and 2, the metal layer 112, 114 is a line or via of a dual damascene metallization layer. In another example, the metal layer 112, 114 is a line or via of a single damascene metallization layer.

Referring now to FIGS. 3-21, FIG. 3 shows an example method 300 of forming a metallization layer in a wafer as part of an electronic device fabrication process. The method 300 includes a method to form a metal layer as part of the metallization layer fabrication. The described metal layer formation techniques can be used in a variety of applications, including forming a metal via in a single damascene process, forming a metal line feature in a single damascene process, forming a combination metal line and via in a dual damascene process, etc. The method 300 is described below in the formation of the combination dual damascene metal line 114 and via 112. FIGS. 4-21 show the wafer 100 of FIGS. 1 and 2 undergoing fabrication processing according to the method 300. The example structure is referred to as a metal layer, which includes both the via portion 112 and the metal line portion 114, and the following discussion refers to the structure as a metal layer although the layer is formed by a multipass or multistep electroplating process with intervening rinse and drying operations.

In the metallization layer example, the metal layer formation process includes multistep or multipass electroplating with intervening rinse and drying operations. In applications involving thick copper layers, breaking up the deposition helps to reduce the formation of hillock defects, and helps to limit the growth of passivating films on the anode of the electroplating system. Moreover, the described examples mitigate copper hillocks independent of the subsequent thermal processing of the wafer, such as post deposition annealing, and thus provide a solution without additional process steps in the process flow or changes in processing temperatures of subsequent processes. In this regard, post-electroplating annealing conditions may influence the rate of hillock defect formation. However, the dependence of via stress migration on annealing temperature limits the ability to co-optimize the anneal temperature settings for both stress migration and hillock density. The multipass plating approach of the example method 300 offers the ability to mitigate hillock defect density independently through the deposition recipe by multiple plating steps with intervening rinsing and drying steps. The described techniques can be advantageously employed to create plated copper or other plated metal layers of a desired final thickness independent of the voltages and currents used in the plating steps, in contrast to varying currents during a single step plating process.

Figure 3:
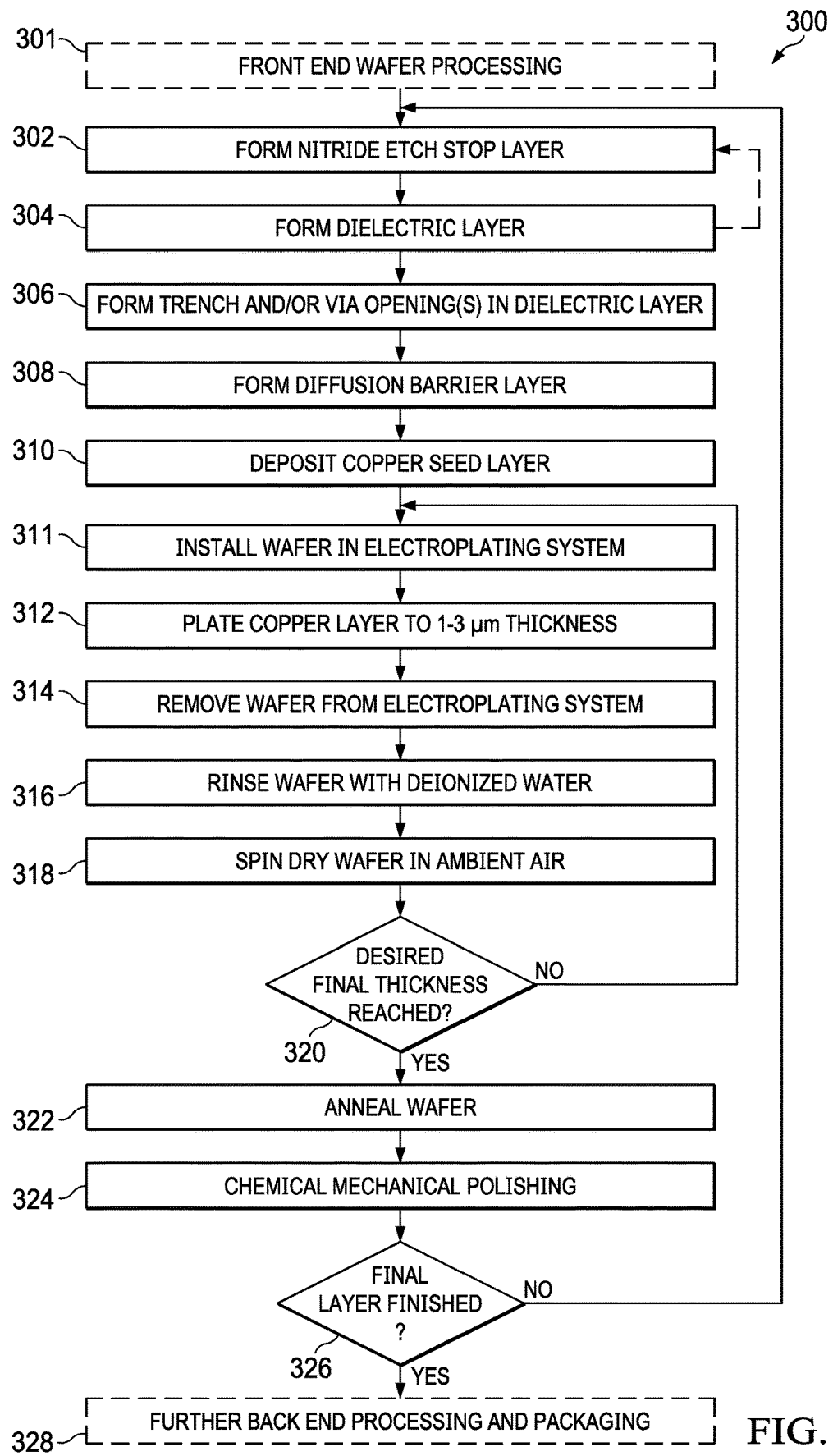
FIG. 3 is a flow diagram of a method of forming a metallization layer in a wafer, with an included method to form a metal layer.

The method 300 begins at 301 in FIG. 3 with front end wafer processing. In one example, the front end processing at 301 includes forming one or more electronic components on and/or in a semiconductor wafer, such as fabrication of the isolation structures 103 and the transistor component 101 on and/or in the semiconductor substrate 102 in FIG. 1 above. The front end wafer processing 301 in one example also includes forming the initial PMD layer 104 and the tungsten contacts 105 in FIG. 1.

The method 300 continues with fabrication of one or more of the upper metallization layers, such as the layers 106 and 110 in FIGS. 1 and 2 above. The described multipass metal layer fabrication methods can be used to form a metal layer in any application as part of an electronic device fabrication process, including metallization structure fabrication and other fabrication steps where a metal layer is to be formed by electroplating. The method 300 is described below in connection with fabrication of the uppermost metallization layer 110 (e.g., FIG. 2). The described processing can be used to fabricate other metallization layers, such as the first metallization layer 106, and these techniques can be used to fabricate individual metallization layers of a multilayer metallization structure, or to form a metal layer in a single layer metallization structure.

At 302 in FIG. 3, the method 300 includes forming an etch stop layer at 302. FIG. 4 shows one example, in which a deposition process 400 is performed that deposits a nitride material or other suitable etch stop layer 208 on a previously formed first metallization layer. The example of FIG. 4 begins with the previously formed first metallization layer 106 of FIGS. 1 and 2, which includes the illustrated portions of the first layer metal lines 109 (e.g., copper), a portion of the associated conductive diffusion barrier layer 206, and the dielectric sublayer 204 (e.g., SiO$_2$). Any suitable deposition processing 400 can be used to form the etch stop layer 208 at 302.

Referring also to FIG. 5, the method 300 continues at 304 in FIG. 3 with formation of a dielectric layer, such as a sublayer of a dual damascene metallization layer. FIG. 5 shows one example in which a dielectric deposition process 500 is performed that deposits silicon dioxide or other suitable dielectric material 201 over the etch stop layer 208. In the illustrated example, the material 201 forms a first sublayer through which subsequently formed conductive (e.g., copper) vias will extend to provide an electrical connection to the first layer metal line structure 109.

Referring also to FIGS. 6 and 7, the example dual damascene implementation of the method 300 continues at 302 with deposition of a second etch stop layer (e.g., a nitride material). FIG. 6 shows one example, in which a deposition process 600 is performed that deposits the second etch stop layer 200 on the top side of the first dielectric sublayer 201. Continuing at 304, the second dielectric sublayer is formed. FIG. 7 shows one example, in which a second dielectric deposition process 700 is performed that deposits the second dielectric sublayer 202 (e.g., SiO$_2$) on the second etch stop layer 200.

Referring also to FIG. 8, the method 300 continues at 306 in FIG. 3 with forming a trench and/or via opening or openings in one or more dielectric layers. FIG. 8 shows one example, in which a trench formation process 800 is performed that creates a combination trench and via opening 804 in the dielectric sublayers 201 and 202. The processing 800 in this example is referred to as a via first process that includes forming a first etch mask (not shown) which exposes portions of a prospective via opening in the lower sublayer 201, followed by etching to remove the exposed portions of the upper sublayer 202, the upper etch stop layer 200, the lower sublayer 201, and the lower etch stop layer 208 to expose a portion of the first layer metal line 109. The first etch mask is then stripped or otherwise removed, and a second etch mask 802 is formed, which exposes portions of a prospective line opening in the upper sublayer 202. Further etching is then performed that removes exposed portions of the upper dielectric sublayer 202, stopping on the remaining upper etch stop layer 202 as shown in FIG. 8.

Referring also to FIG. 9, the method 300 continues at 308 in FIG. 3 with formation of a diffusion barrier layer. FIG. 9 shows one example, in which a deposition process 900 is performed that deposits a conductive diffusion barrier layer 210 in the opening 804. The deposited diffusion barrier layer 210 in this example extends over the exposed portions of the upper dielectric sublayer 202, the upper etch stop layer 200, the exposed sidewall portions of the lower dielectric sublayer 201, the exposed sidewall portion of the lower etch stop layer 208, and the exposed upper portion of the first layer metal line 109. Any suitable conductive diffusion barrier material and deposition process 900 may be used to form the diffusion barrier layer 210 at 308.

Referring also to FIG. 10, the method 300 continues at 310 with forming a metal seed layer in the opening. FIG. 10 shows one example, in which a deposition process 1000 is performed that deposits a metal seed layer 212 in the opening 804. In the illustrated example, the deposition process 1000 is a physical vapor deposition (PVD) process that deposits a copper seed layer 212 on the diffusion barrier layer 210 in the opening 804. As shown in the example of FIGS. 9 and 10, the deposited diffusion barrier layer 210 and the metal seed layer 212 are formed in the opening, and also extend over the exposed top side of the upper dielectric sublayer 202.

Referring also to FIGS. 11-13 and 24, the method 300 continues at 311-320 in FIG. 3 with a first pass of a multipass or multistep electroplating deposition with intervening rinse and dry operations to form a metal layer. At 311 in FIG. 3, the wafer is installed in an electroplating system. FIG. 24 shows an example electroplating system 2400 with a DC voltage source 2402, an electrical connector 2404 that electrically connects the negative (−) terminal of the DC voltage source 2402 with the wafer 100, and a wafer holder 2406 that mechanically supports the wafer 100. The electroplating system 2400 also includes an electrode 2408 connected to the positive (+) terminal of the DC voltage source 2402. The wafer 100, the wafer holder 2406, and the electrode 2408 are submerged in a fluid 2410 within a container 2412. At 311 in FIG. 3, the wafer 100 is installed in the system 2400, and is electrically connected to the negative terminal of the DC voltage source 2402.

Referring also to FIG. 11, the first plating pass is performed at 312 in FIG. 3. In one example, the plating at 312 includes performing a first electroplating process to deposit a first metal layer to a first thickness on the metal seed layer. FIG. 11 shows one example, in which a first electroplating process 1100 is performed that deposits a portion of the first metal layer 112, 114 to a non-zero first thickness 1102 on the metal seed layer 212. In one example, the plated material is copper and the first thickness 1102 is in a range of 0.5-5 μm, such as 1-3 μm (e.g., 1 μm or more and 3 μm or less). In one specific example, the first thickness 1102 is in a range of 2 μm or more and 3 μm or less. As shown in FIG. 11, the electroplating process 1100 deposits the metal material 112, 114 on the exposed surfaces of the seed layer 212 in the dielectric layer openings for both the prospective via 112 and the prospective line feature 114, as well as on the top side of the wafer 100. At 314 in FIG. 3, the wafer is removed from the electroplating system after the first electroplating process 1100.

Referring also to FIG. 12, the first pass continues at 316 with rinsing the wafer with deionized water. FIG. 12 shows one example in which a deionized water rinse process 1200 is performed (referred to as a DI rinse) to rinse the exposed surface of the plated copper material 112, 114 with deionized water.

Figure 13:
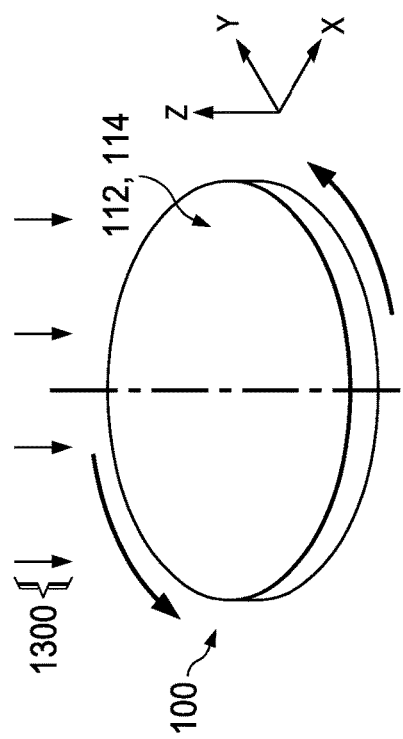

Referring also to FIG. 13, the first pass processing continues at 318 in FIG. 3 with drying the wafer after the first rinse process 1200. FIG. 13 shows one example, in which a spin drying process 1300 is performed that dries the wafer 100 in ambient air. This example includes rotating the wafer 100 as part of the drying process 1300. In the example of FIG. 13, the wafer 100 is rotated in a counterclockwise direction, although rotational or other nonrotating drying processes can be used in other implementations. Other ambient environments can be used in other implementations.

The method 300 continues at 320 in FIG. 3, where a determination is made as to whether a desired final thickness has been reached. In practice, various implementations involve at least two passes through the processing at 311-318. After the above-described initial pass, the metal layer 112, 114 is not yet at the desired final thickness. Accordingly (NO at 320), the method 300 returns to 311, where the wafer is reinstalled in the electroplating system (e.g., wafer 100 is again installed in the system 2400 of FIG. 24). After the initial drying process 1300, the further passes of the multipass processing include performing one or more additional electroplating processes (e.g., at 312) that respectively deposit an additional metal layer 112, 114 to a non-zero second thickness on the proceeding metal layer, until a total thickness of the first and additional metal layers reaches or exceeds a non-zero desired final thickness. After each of the additional electroplating processes, the wafer 100 is removed from the electroplating system 2400 (e.g., at 311), and an additional rinse process is performed (e.g., at 316) that rinses the additional metal layer 112, 114 with deionized water. After each of the additional rinse processes, an additional drying process is performed (e.g., at 318).

Figure 14:
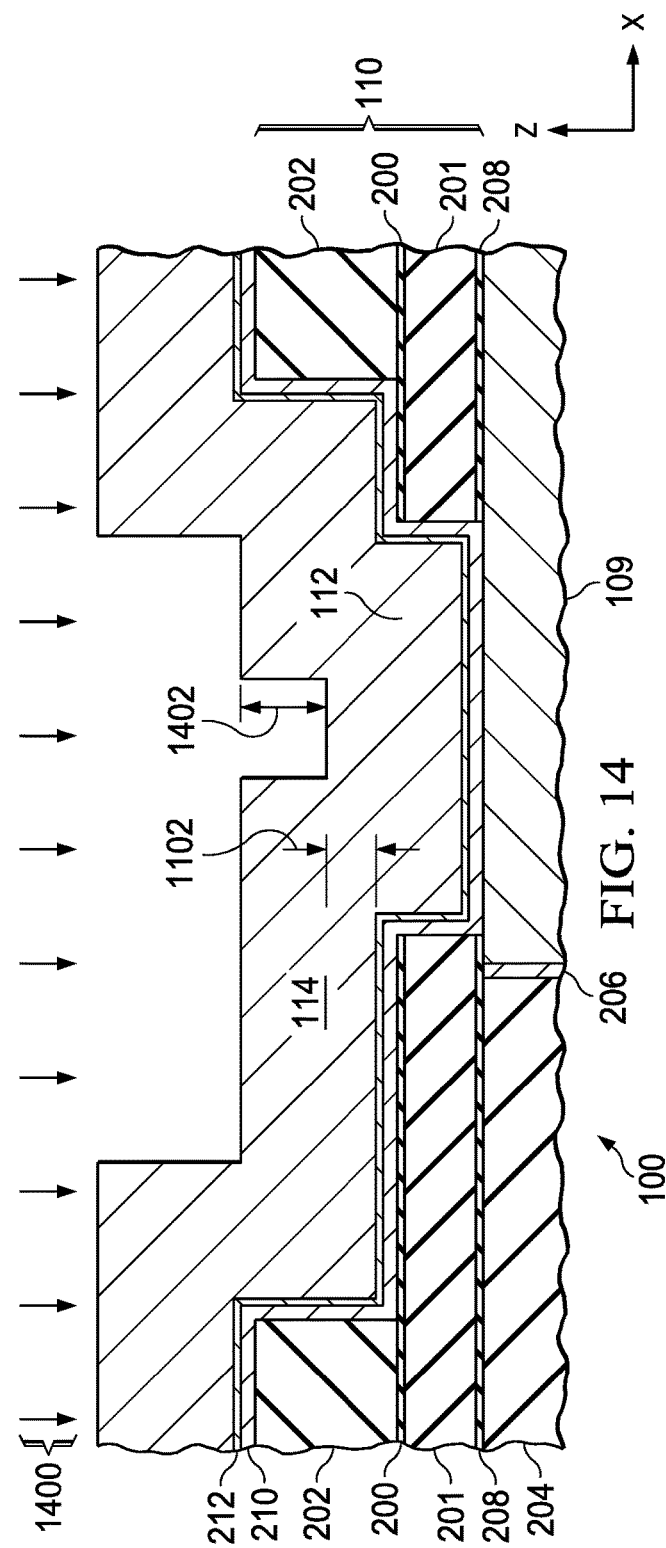
Figure 15:
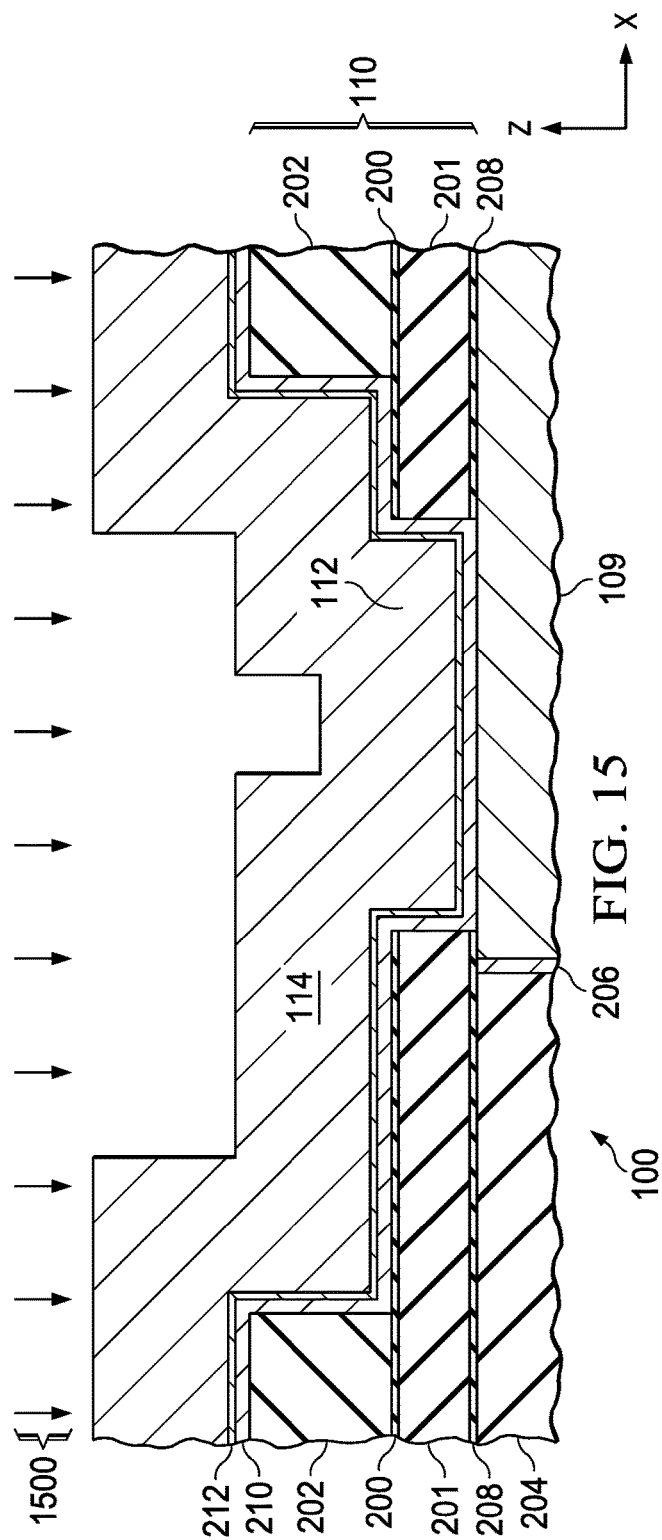
Figure 16:
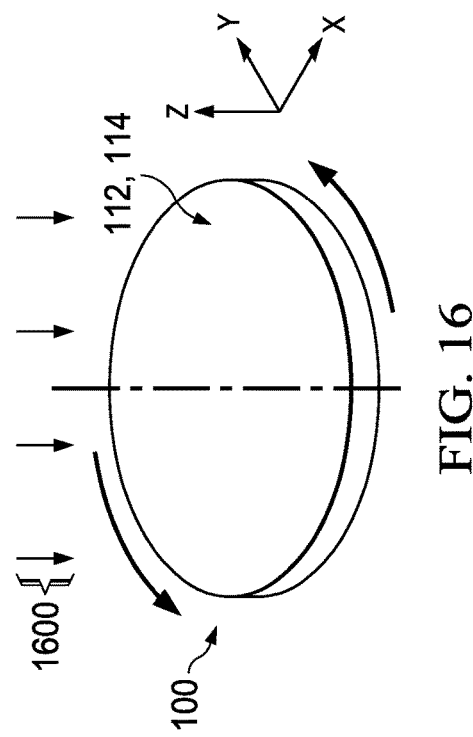

Referring also to FIGS. 14-16, one example implementation of the method 300 includes three passes. The second pass of the example multipass electroplating processing includes performing a second electroplating process at 312 to deposit a second metal layer 112, 114 (e.g., a second portion of the composite via and line structure 112, 114) to a non-zero second thickness on the first portion of the metal layer 112, 114. FIG. 14 shows one example, in which a second electroplating process 1400 is performed that deposits a second metal layer 112, 114 to a second thickness 1402 on the first metal layer 112, 114. The individual pass thicknesses can be the same, or can be different in various implementations. In one example, the second thickness 1402 is approximately the same as the first thickness 1102 (FIG. 11 above), and both thicknesses are in the first range of 0.5-5 µm, such as 1 µm or more and 3 µm or less. In one specific example, the first thickness 1102 and the second thickness 1402 are 2 µm or more and 3 µm or less. After the second electroplating process 1400, the wafer 100 is again removed from the electroplating system 2400 at 314 (FIG. 3). A second rinse process is performed at 316 (e.g., a second rinse process 1500 in FIG. 15) that rinses the second metal layer 112, 114 with deionized water. After the second rinse process 1500, a second drying process is performed at 318 (e.g., spin drying process 1600 in FIG. 16) that dries the wafer 100.

Figure 17:
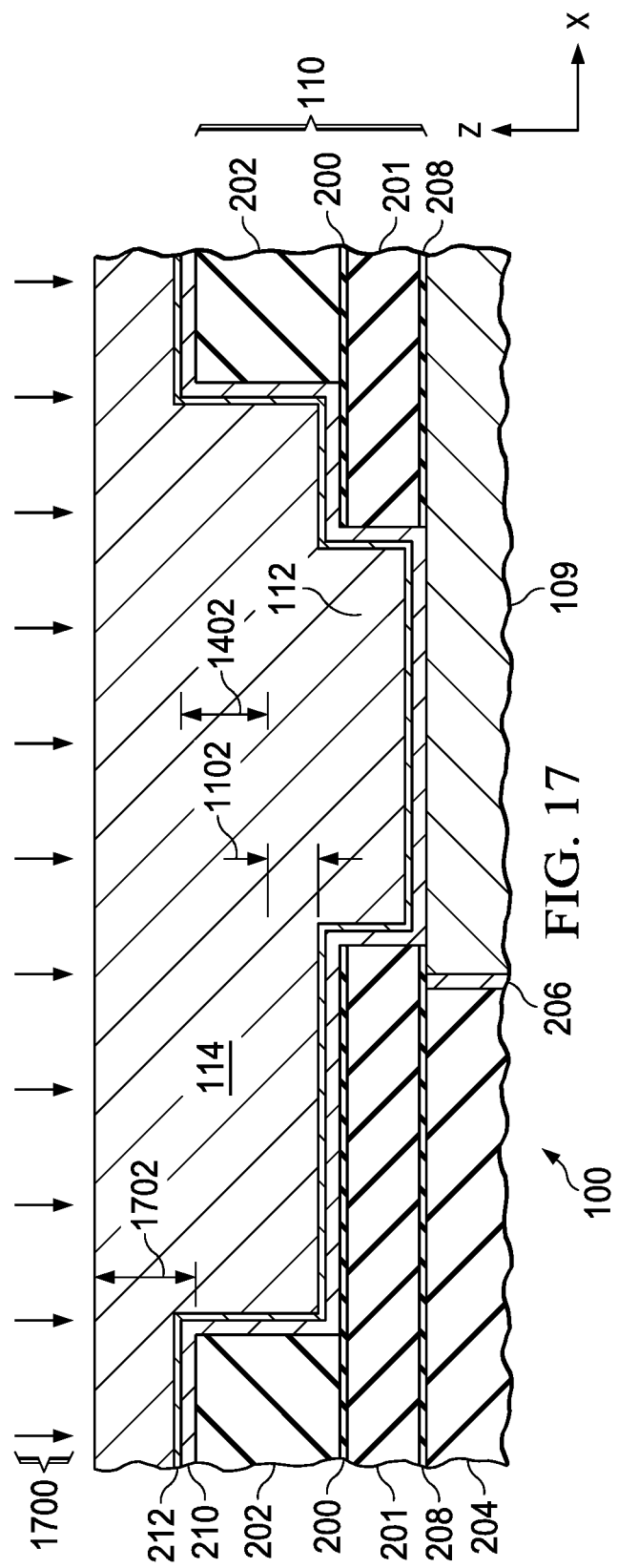

Referring also to FIGS. 17-19, the example multipass plating implementation includes a third pass, in which the wafer 100 is again installed in the electroplating system at 311 in FIG. 3. In the third pass, a third electroplating process is performed at 312 (e.g., third plating process 1700 in FIG. 17), which deposits further copper to a non-zero third thickness 1702, where the third thickness 1702 can be the same or different than the first and second thicknesses 1102 and 1402 in various implementations. The third pass continues with removal of the wafer from the electroplating system at 314, and rinsing the wafer with deionized water at 316 (e.g., third rinse process 1800 in FIG. 18). After the third rinsing process 1800, the wafer is dried at 318 (e.g., a third spin drying process 1900 in FIG. 19).

Figure 20:
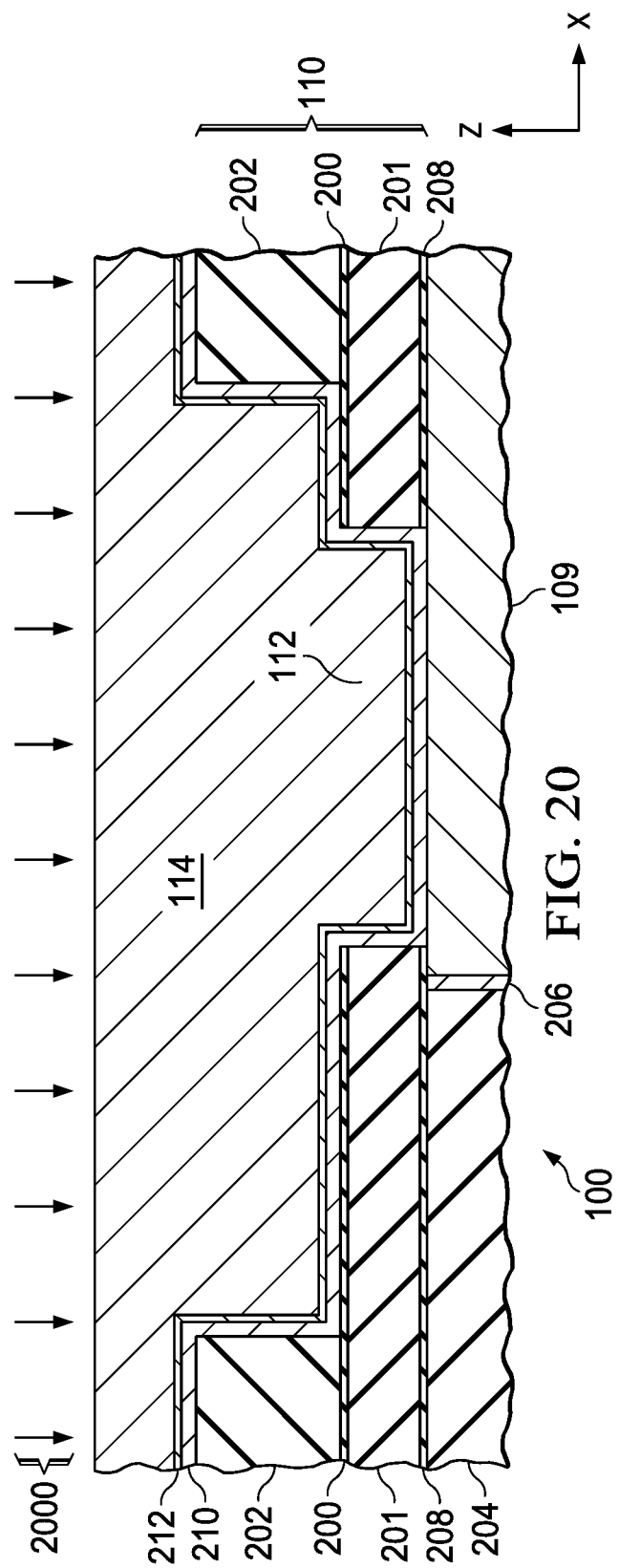
Figure 21:
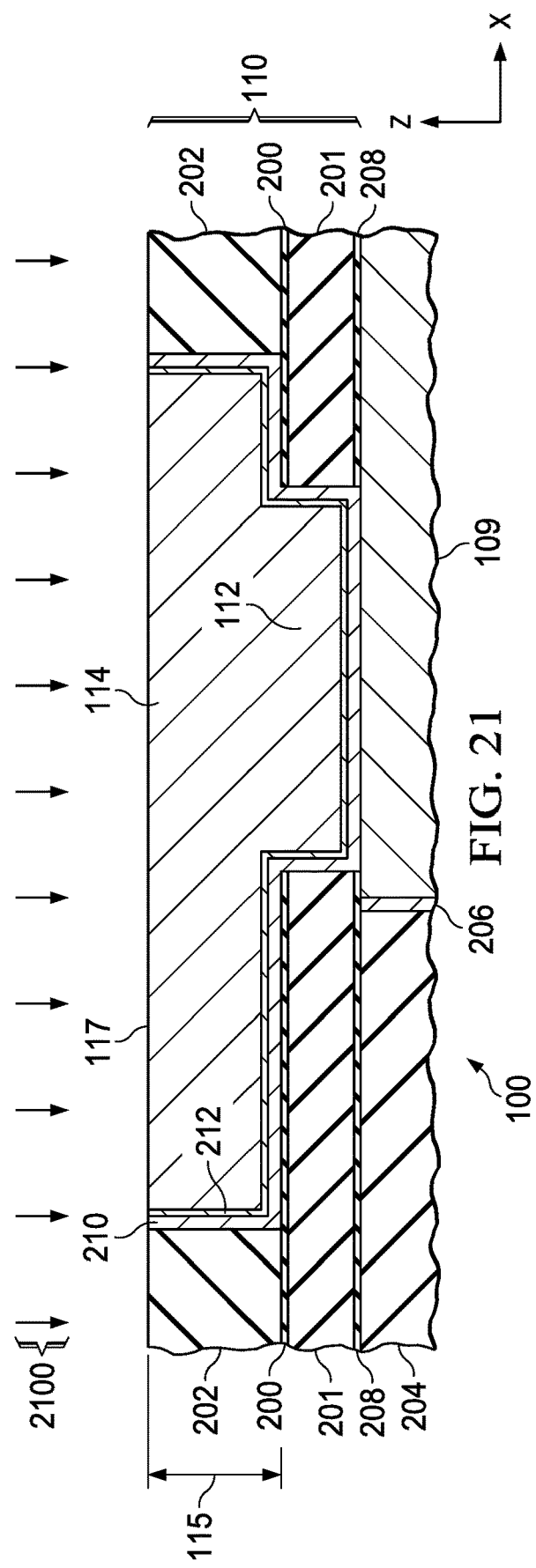

Referring also to FIGS. 20 and 21, after the final rinse process 1800 (e.g., once the desired final thickness is reached or exceeded, YES at 320 in FIG. 3), the method 300 continues at 322 with annealing the wafer. FIG. 20 shows one example, in which an annealing process 2000 is performed that anneals the deposited copper metal layer 112, 114. Following the wafer anneal, the method 300 proceeds to 324 where a planarization process is performed. FIG. 21 shows one example, in which a chemical mechanical polishing (CMP) process 2100 is performed that planarizes the top side or surface of the wafer 100. In the example of FIG. 21, the CMP process 2100 is continued until the desired final thickness 115 is achieved, in this case for the upper line feature portion 114. The CMP process 1200 in this example removes any excess portions of the seed copper layer 212 and the underlying diffusion barrier layer 210 on the top side of the upper dielectric sublayer 202 as shown in FIG. 21. The final desired thickness can alternatively be measured in terms of the total vertical thickness (e.g., along the Z axis) of the combined via and line metal layer structure 112, 114 in other implementations.

Continuing at 326 in FIG. 3, the example multilayer metallization structure fabrication process 300 also includes determining at 326 whether a final metallization structure layer is finished. If not (NO at 326), the method 300 returns to form another etch stop layer and dielectric layer at 302 and 304 as described above to construct the next metallization structure layer. If the final layer has been completed (YES at 326), the method 300 proceeds with further back end processing and packaging at 328 (not shown).

Referring now to FIGS. 22 and 23, FIG. 22 shows a top view of a 300 mm diameter processed wafer 2200 with a top copper metal layer formed to a thickness of approximately 5.6 µm using a single pass or single step electroplating process. The plated copper layer of the wafer 2200 in FIG. 22 has hillock protrusion defects 2202 of 0.2 µm or more. In one example, the single pass processed wafer 2200 has a defect density of around 900 or more defects/m$^2$ for protrusion defects that extend outwardly from the upper surface of the wafer 2200 by 0.2 µm or more. FIG. 23 shows an example implementation of the wafer 100 with a top copper metal layer (e.g., the upper side of the copper layer 112, 114 of FIG. 2) with a total final thickness of approximately 5.6 µm formed using the example multipass process 300. In this example, the wafer 100 has a defect density of around 500 defects/m$^2$ for protrusion defects that extend outwardly from the upper surface of the wafer 2200 by 0.2 µm or less. In certain examples, the described techniques exemplified by the method 300 of FIG. 3 can be used to fabricate electronic devices with a metallization structure having a metal layer (e.g., layer 112, 114) with a thickness 115 greater than 2 µm (e.g., more than 5 µm, such as around 6 µm) and a defect density of less than 700 defects/m2 for protrusions of 0.2 µm or more from the upper surface 117.

Modifications are possible in the described embodiments, and other embodiments are possible, within the scope of the claims.

The following is claimed:

1. A method of forming a metal layer, the method comprising:
    installing a wafer in an electroplating system;
    performing a first electroplating process in the electroplating system, wherein the first electroplating process deposits a first metal layer to a non-zero first thickness on a metal seed layer of the wafer;
    removing the wafer from the electroplating system after the first electroplating process;
    performing a first rinse process that rinses the first metal layer with deionized water;
    performing a first drying process that dries the wafer after the first rinse process;
    installing the wafer in the electroplating system after the first drying process;
    performing a second electroplating process in the electroplating system, wherein the second electroplating process deposits a second metal layer to a non-zero second thickness on the first metal layer;
    removing the wafer from the electroplating system after the second electroplating process;
    performing a second rinse process that rinses the second metal layer with deionized water;
    performing a second drying process that dries the wafer after the second rinse process, and
    after completing all the electroplating, rinsing, and drying processes of the metal layer without annealing the first and second metal layers, annealing the first and second metal layers.

2. The method of claim 1, wherein the metal seed layer and the first and second metal layers are copper.

3. The method of claim 1, wherein the non-zero first thickness is in a first range of 0.5 µm or more and 5 µm or less.

4. The method of claim 3, wherein the non-zero second thickness is in the first range.

5. The method of claim 3, wherein the non-zero first thickness is in a first range of 1 µm or more and 3 µm or less.

6. The method of claim 5, wherein the non-zero second thickness is in the first range.

7. The method of claim 1, wherein performing the first and second drying processes includes rotating the wafer.

8. The method of claim 1, further comprising:
    performing one or more additional electroplating processes in the electroplating system, wherein the one or more additional electroplating processes deposit one or more additional metal layers to a non-zero thickness over the second metal layer;
    removing the wafer from the electroplating system after each of the additional electroplating processes;
    performing an additional rinse process that rinses the additional metal layer with deionized water; and
    performing one or more additional drying processes that dries the wafer after each of the additional rinse processes.

9. A method of forming a metallization layer over a wafer, the method comprising:
    performing a first deposition process that deposits a dielectric layer on the wafer;
    forming an opening in the dielectric layer;
    performing a second deposition process that deposits a metal seed layer in the opening;
    performing a first electroplating process that deposits a first metal layer to a non-zero first thickness on the metal seed layer;
    after the first electroplating process, performing a first rinse process that rinses the first metal layer with deionized water;
    after the first rinse process, performing a first drying process that dries the wafer;
    after the first drying process:
        performing one or more additional electroplating processes that respectively deposit an additional metal layer to a non-zero second thickness over the first metal layer, until a total thickness of the first and additional metal layers exceeds a non-zero desired final thickness;
        after each of the additional electroplating processes, performing an additional rinse process that rinses the additional metal layer with deionized water;
        after each of the additional rinse processes, performing an additional drying process that dries the wafer;
    after a final one of the additional rinse processes, performing an annealing process that first anneals the first and additional metal layers; and
    after the annealing process, performing a chemical mechanical polishing (CMP) process that removes excess material from a top surface of the additional metal layers.

10. The method of claim 9, further comprising:
    before depositing the metal seed layer, performing a third deposition process that deposits a diffusion barrier layer in the opening.

11. The method of claim 9, wherein the metal seed layer and the first and second metal layers are copper.

12. The method of claim 9, wherein the non-zero first thickness is in a first range of 0.5 µm or more and 5 µm or less.

13. The method of claim 12, wherein the non-zero second thickness is in the first range.

14. The method of claim 12, wherein the non-zero first thickness is in a first range of 1 µm or more and 3 µm or less.

15. The method of claim 14, wherein the non-zero second thickness is in the first range.

16. The method of claim 12, wherein performing the first drying process and the additional drying processes includes rotating the wafer.

17. A method of fabricating an integrated circuit, the method comprising:
    performing a first deposition process that deposits a dielectric layer on a substrate;
    forming an opening in the dielectric layer;
    performing a second deposition process that deposits a metal seed layer in the opening and over the dielectric layer adjacent the opening;
    performing a first electroplating process that deposits a first metal layer to a non-zero first thickness on the metal seed layer both in the opening and over the dielectric layer adjacent the opening;
    after the first electroplating process, performing a first rinse process that rinses the first metal layer with deionized water;
    after the first rinse process, performing a first drying process that dries the wafer;
    after the first drying process:
        performing one or more additional electroplating processes that respectively deposit an additional metal layer to a non-zero second thickness over the first metal layer including over portions of the first metal layer in the opening and portions of the metal layer over the dielectric layer adjacent the opening;

after each of the additional electroplating processes, performing an additional rinse process that rinses the additional metal layer with deionized water;

after each of the additional rinse processes, performing an additional drying process that dries the wafer;

after a final one of the additional rinse processes, performing a first anneal of the first and additional metal layers, wherein the first anneal is a first occurring anneal process since the deposition of the first metal layer; and after the annealing process, performing a chemical mechanical polishing (CMP) process that removes excess material from a top surface of the additional metal layers.

* * * * *